US006900516B1

United States Patent
Bänisch et al.

(10) Patent No.: US 6,900,516 B1
(45) Date of Patent: May 31, 2005

(54) SEMICONDUCTOR FUSE DEVICE

(75) Inventors: Andreas Bänisch, Munich (DE);
Franz-Xaver Obergrussberger, Pleiskirchen (DE)

(73) Assignee: Infineon Technologies AG, Munich (DE)

(*) Notice: Subject to any disclaimer, the term of this patent is extended or adjusted under 35 U.S.C. 154(b) by 166 days.

(21) Appl. No.: 10/616,234

(22) Filed: Jul. 9, 2003

(30) Foreign Application Priority Data

Jul. 10, 2002 (DE) .......................... 102 31 206

(51) Int. Cl.⁷ ............................... H01L 21/425
(52) U.S. Cl. .................. 257/529; 257/209; 257/758; 438/281; 438/333
(58) Field of Search ...................... 257/209, 529, 257/758; 438/118, 623, 128, 129, 132, 215, 281, 333, 601; 327/525

(56) References Cited

U.S. PATENT DOCUMENTS

| 6,407,586 B2 | 6/2002 | Fischer et al. | |
| 6,525,398 B1 * | 2/2003 | Kim et al. | 257/529 |
| 6,774,456 B2 * | 8/2004 | Rusch et al. | 257/529 |
| 2001/0019167 A1 | 9/2001 | Fischer et al. | |
| 2002/0100957 A1 | 8/2002 | Rusch et al. | |

FOREIGN PATENT DOCUMENTS

| DE | 199 26 499 A1 | 3/2001 |
| DE | 100 06 243 A1 | 8/2001 |
| EP | 0 987 759 A2 | 3/2000 |

* cited by examiner

Primary Examiner—David Nelms
Assistant Examiner—Long Tran
(74) Attorney, Agent, or Firm—Fish & Richardson P.C.

(57) ABSTRACT

An increased number of fuses per area are provided in this semiconductor device while complying with the predetermined distance between the fuses. The device having a first patterned, conductive interconnect plane on a passivated substrate; a second patterned, conductive interconnect plane on the first patterned, conductive passivated interconnect plane; contact devices for selectively electrically contact-connecting the patterned, conductive interconnect planes to one another; a fuse device in a nonpassivated section of the second patterned, conductive interconnect plane with predetermined fuse regions for selectively linking interconnects; the fuse device being divided into fuse modules with fuse pairs and the fuse regions thereof at a predetermined distance from one another, which can be linked to a predetermined potential via a central interconnect.

8 Claims, 4 Drawing Sheets

SEMICONDUCTOR FUSE DEVICE

RELATED APPLICATIONS

This application claims priority from German Application Serial No. 102 31 206.0, filed Jul. 10, 2002, the contents of which are incorporated herein by reference.

TECHNICAL FIELD

This invention relates to a semiconductor device, and in particular to a semiconductor memory device.

BACKGROUND

Semiconductor devices, and in particular semiconductor memory devices such as DRAM memory modules, are generally provided with redundant word or bit lines. This redundancy ensures operation even if, for example, in the complex process for fabricating the delicate structures, one word or bit line is interrupted or short-circuited with another. These faults are detected in a wafer test and corrected at the wafer level, if possible by incorporating redundant word or bit lines. The redundant lines are linked via fuses which are blown by means of a laser beam pulse having a predetermined energy content. This pulse, in accordance with the wafer test, forwards a predetermined potential preferably to a downstream latch device or not to forward it in the blown state.

The increased integration density and the use of the double data rate (DDR) scheme in DRAM memories requires more redundancies and therefore, more fuses are required for linking them. However, the fuses that are to be blown in a manner dependent on the wafer test result cannot be arranged arbitrarily close together. This arrangement is important because on the one hand, the laser for blowing the fuses cannot be adjusted with arbitrary precision and, on the other hand, the laser energy pulse must be sufficient to melt the conductive material of the fuse without, the adjacent fuse likewise being blown at the same time in an undesirable manner. The fuses must also be arranged in a manner to avoid residues of the melted fuse which might in turn produce a short circuit. Furthermore, a complex arrangement of the fuses is not desirable since the blowing of the fuses by means of the laser must be able to be carried out in a short time (i.e. efficiently). Hitherto the laser device has not been able to adjusted with arbitrary two-dimensional precision and rapidity with regard to the wafer.

FIG. 4 illustrates a customary semiconductor device with a known fuse layout in plan view. A first patterned, conductive interconnect plane 11, which forms interconnects in the region of the fuse device, is provided on a passivated semiconductor substrate 10. Situated above said plane 11 is a second patterned, conductive interconnect plane 13, which is isolated from the first patterned, conductive interconnect plane 11 by a passivation 12 and likewise forms interconnects. A third patterned, conductive interconnect plane 15, which is arranged above the second patterned, conductive interconnect plane 13 and is likewise spaced apart from the second patterned, conductive interconnect plane 13 by a passivation 14. Fuse regions 17 are provided in two rows. In order to be able to blow this upper patterned conductive interconnect plane 15 or the fuse region 17 of this interconnect plane by means of the laser, it must be directly accessible from above. Therefore, in the passivation layer 16 applied on the wafer, windows 24 are provided above the fuse devices, in which no passivation 16 is provided.

Via contact devices 19, 20, the interconnects of the third patterned, conductive interconnect plane 15 are selectively connected either to the first patterned, conductive interconnect plane 11 or the second patterned, conductive interconnect plane 13. These contacts are made so that, in the known layout three fuses 17 are in each case accessible via three interconnect planes 11, 13, 15 in the plane of the drawing and can be contact-connected via the terminal region thereof (on the right-hand side) according to layout of FIG. 4.

On the left-hand side, all the conductive planes 11, 13, 15 are provided with a predetermined potential which is or is not connected to the terminals on the right-hand side depending on whether or not a fuse is blown in the fuse region 17. Whilst complying with the required distance 18 (fuse pitch) between the adjacent fuses 17 of this conventional left/right "trident" fuse arrangement, there are only a small number of fuses available per area. Furthermore, the contact devices between the various electrically conductive, patterned interconnect planes 11, 13, 15 are exposed, particularly in the accelerated stress test, to an increased corrosion resulting in failures of the contact devices. This type of failure is referred to as "HAST fails".

SUMMARY

The objective of the present invention is to provide a semiconductor device which enables an increased number of fuses per area while complying with a predetermined distance between fuses of the semiconductor device. The idea underlying the present invention essentially consists in the fact that the fuses of a fuse module are provided in pairs with a central potential link. The present invention solves the afore mentioned problem by the providing a fuse device in a nonpassivated section of a patterned, conductive interconnect plane with predetermined fuse regions for selectively linking interconnects, the fuse device being divided into fuse modules with fuse pairs and the fuse regions thereof at a predetermined distance from one another, which can be linked to a predetermined potential via a central interconnect of the patterned, conductive interconnect plane.

Thus, semiconductor devices of the type according to the invention enable a higher fuse area density on account of their fuse pair module arrangement. In accordance with one preferred embodiment, the contact devices for selectively electrically contact-connecting the patterned conductive interconnect planes or interconnects to one another are provided in a passivated section. If the semiconductor device is configured in this way, then the corrosion of the contact devices is avoided since they lie outside the window without passivation. Thus, a possible failures of the contact devices, particularly during a stress test, are avoided.

In accordance with a further preferred development, the fuse pairs linked via the central interconnect extend at night angles to the central interconnect. This enables a clear structure.

In accordance with a further preferred development, the fuse pairs linked via the central interconnect are essentially at an acute angle to the central interconnect. This provides the advantage that the fuses to be blown, i.e. the interconnects, run diagonally. Thus, the hit probability of the laser device for blowing the fuses is increased.

In accordance with a further preferred development, a third patterned, conductive interconnect plane is provided between the passivated substrate and the first patterned, conductive interconnect plane, which is preferably provided as mechanical reinforcement or protection layer. On the one hand, such a third conductive interconnect plane enables a mechanical reinforcement or a protection; on the other hand, it can also be used as an additional interconnect plane for increasing the area or integration density of the fuses.

In accordance with a further preferred development, the device has fuse latches adjoining the interconnects connected to the fuse regions. In particular, these interconnects are provided in a plurality of planes and can be selectively connected to the predetermined potential via the fuse device.

In accordance with a further preferred development, the semiconductor device is a memory device, in particular a DRAM or DDR-DRAM.

Exemplary embodiments of the invention are illustrated in the drawings and are explained in more detail in the description below.

DESCRIPTION OF PREFERRED EMBODIMENTS

In the figures, identical reference symbols designate identical or functionally identical constituent parts.

FIG. 1 shows a diagrammatic view of a semiconductor device for elucidating a first embodiment of the present invention.

Figure 1A:
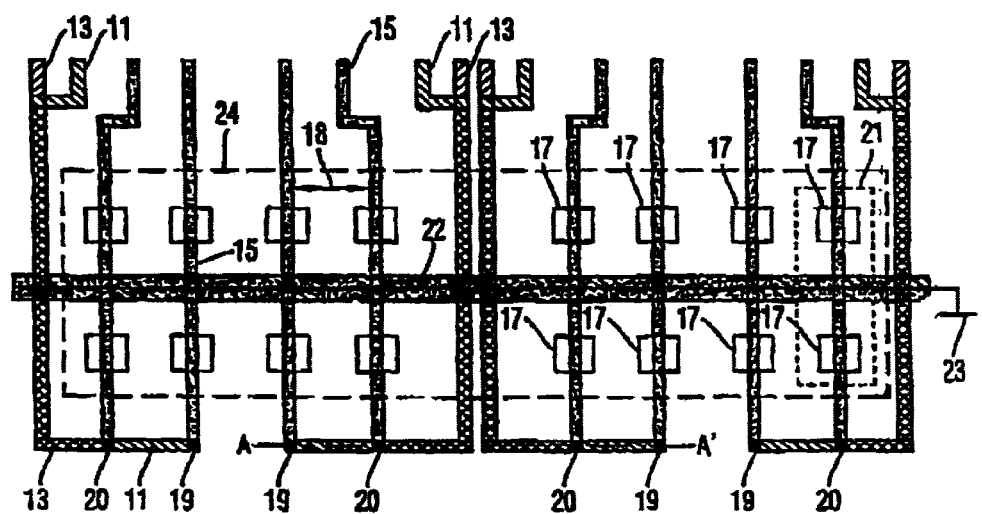
FIGS. 1A and 1B show a diagrammatic illustration of a semiconductor device for elucidating a first embodiment of the present invention, FIG. 1A illustrating a plan view and FIG. 1B a cross section along the line A–A'.

A plan view of a semiconductor device according to the invention with a fuse device is illustrated in FIG. 1A and is explained in more detail with reference to FIG. 1B, which illustrates a cross section of the arrangement along the broken line A–A'.

Figure 1B:
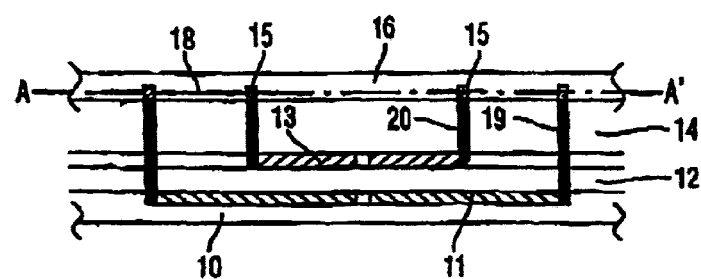

In accordance with FIG. 1B, a patterned, conductive interconnect plane 11 is provided on a preferably passivated semiconductor substrate 10. It is adjoined by preferably at least one passivation layer 12, which is in turn followed by a patterned, conductive interconnect plane 13. A passivation layer 14 is preferably likewise provided above the patterned, conductive interconnect plane 13, a patterned, conductive interconnect plane 15 being arranged on said passivation layer. A further passivation layer 16 is situated above said plane. A predetermined distance 18 (fuse pitch), e.g. 2600 nm, is provided between the structures 15, preferably interconnects made of AlCu, which have adjacent fuses 17 or fuse regions 17, in order to prevent, during the blowing of a fuse 17, an undesirable contact interruption of an adjacent fuse 17 by the energy of the laser pulse.

Preferably, vertical contact devices 19, 20 are provided between the patterned, conductive horizontal interconnect planes 11, 13, 15, the electrical link between interconnects of the upper patterned, electrically conductive interconnect plane 15 and the lower patterned, electrically conductive interconnect plane 11 being produced via the contact devices 19, and the link between the upper patterned, conductive interconnect plane 15 and the middle patterned, conductive interconnect plane 13 being produced via contact devices 20. Spacers (not illustrated), e.g. made of titanium or titanium compounds, between the individual patterned, electrically conductive interconnect planes can likewise be provided.

According to the present invention, the fuses 17 are arranged as fuse pairs 21 and connected to a predetermined potential 23, preferably ground (GND), via a central interconnect 22. The fuses 17 or fuse regions 17 lie in a window 24, in which the topmost passivation layer 16 or covering layer passivation has been cut out or removed. Preferably, the fuse pairs 21 extend perpendicularly from the central interconnect 22.

The interconnects of the conductive, patterned interconnect plane 11 are shown left-hatched in FIG. 1A and the interconnects of the conductive, patterned interconnect plane 13 are shown right-hatched so that a crosshatching serves for illustration purposes in FIG. 1A at locations where the two conductive interconnect planes 11, 13 isolated by a passivation 12 are superimposed in the plan view. The patterned, electrically conductive interconnect plane 15 is illustrated by a dot hatching. In accordance with the present embodiment, the contact devices 19, 20 between the individual patterned, electrically conductive interconnect planes 11, 13, 15 are situated below the covering passivation layer since they are situated outside the window 24, in which the latter is not provided. All the terminal or linking devices are preferably led to one side, e.g. the broad side, and provided by way of example in the interconnect planes 11, 13 and 15.

Figure 2:
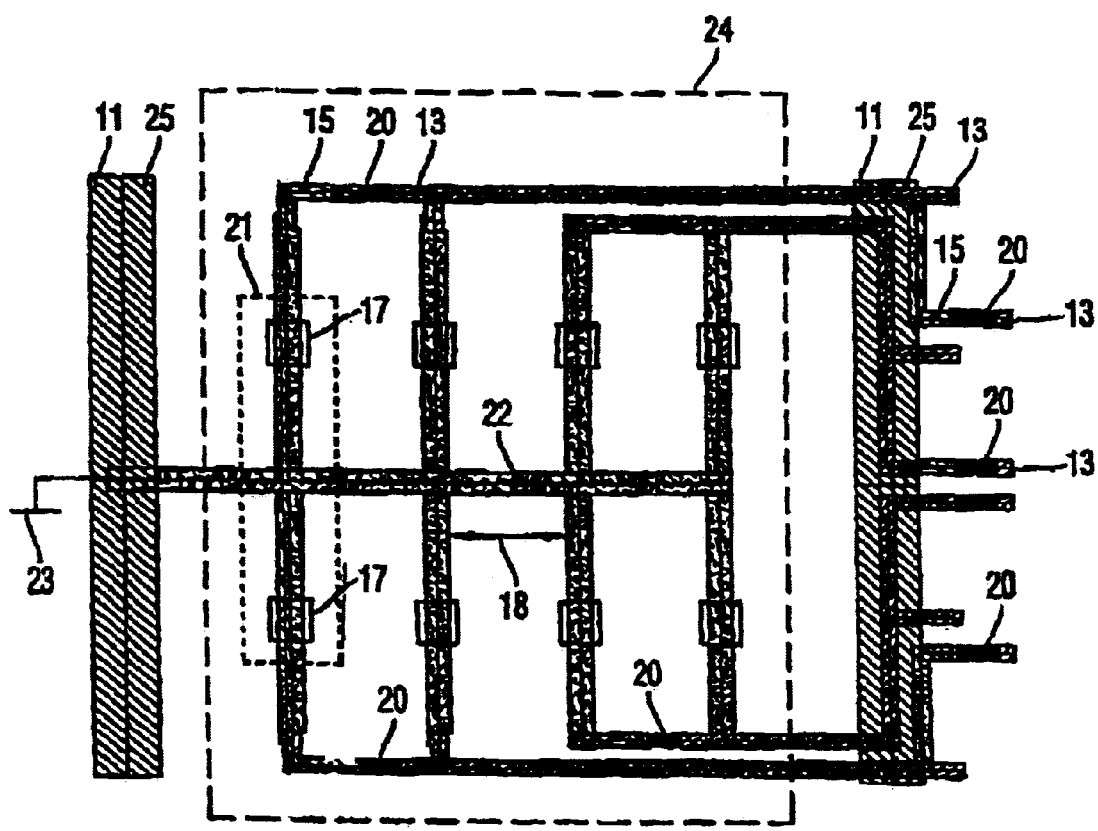
FIG. 2 is a diagrammatic plan view for elucidating a second embodiment of the present invention.

FIG. 2 shows a diagrammatic illustration of a semiconductor device for elucidating a second embodiment of the present invention.

In FIG. 2, the fuse pairs 21 with their fuse regions 17 likewise extend at right angles from the central interconnect 22, which is likewise connected to a predetermined potential 23, preferably ground. Here, too, as in FIG. 1, the fuse pairs 21 are separated from one another by a predetermined distance 18. The interconnect adjoining the fuse devices 17 of the left-hand fuse pair 21 is led from the patterned, conductive plane 15 via the contact device 20 to the patterned, conductive interconnect plane 13 in order to be able to run parallel through a passivation 14 at a distance from the patterned, conductive interconnect plane 15 or the right-hand adjoining fuse pair.

Preferably, provision is made of a further patterned, conductive interconnect plane 11 between the passivated semiconductor substrate 10 and the patterned, conductive interconnect plane 13, which on the one hand provides a protection or structural reinforcement device 25, on the other hand in order to provide possible further interconnects for extending the arrangement in accordance with FIG. 2 from eight to twelve fuses. In contrast to FIG. 1A, in the embodiment in accordance with FIG. 2, the contact devices 20 between the patterned, electrically conductive interconnect planes 11, 13, 15 lie in the window 24, illustrated by a cutout in the covering layer 16 or passivation 16. In the terminal region on the right, the interconnects are led from the two patterned, conductive interconnect planes 13, 15 illustrated here to the electrically conductive interconnect plane 13 by means of the contact devices 20.

Figure 3:
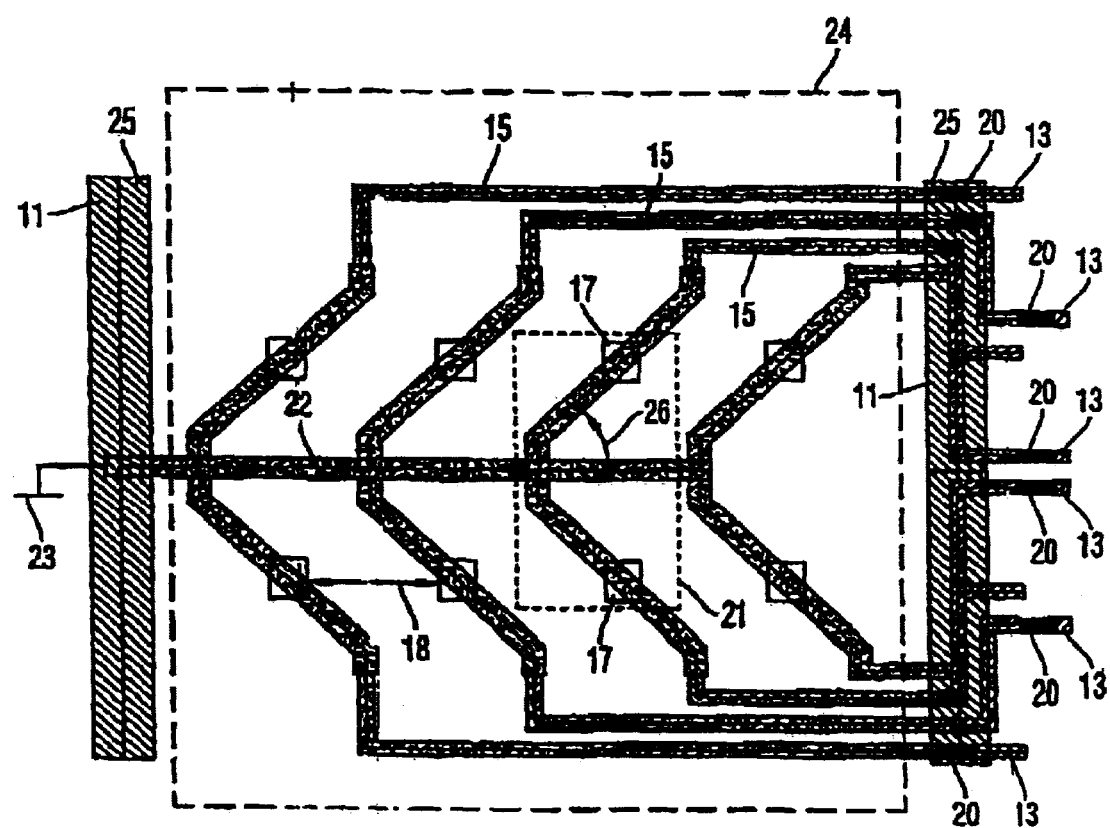
FIG. 3 is a diagrammatic plan view for elucidating a third embodiment of the present invention.
Figure 4:
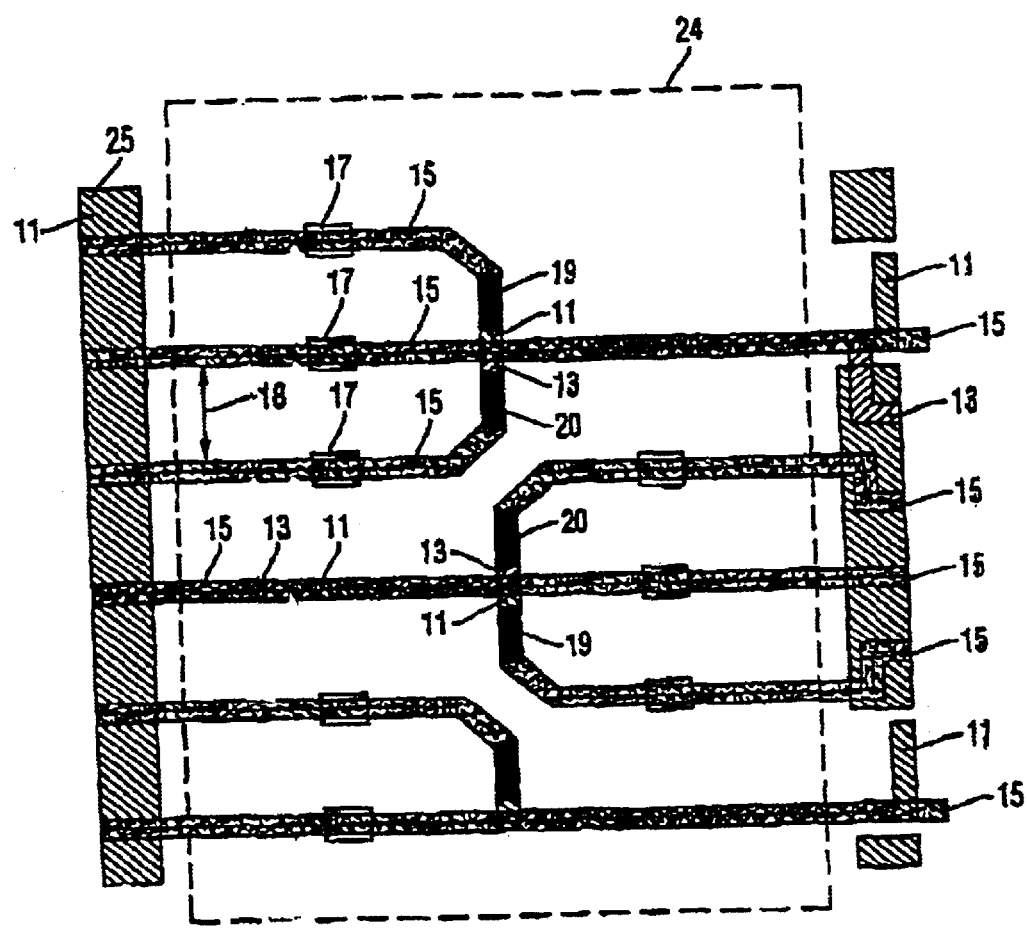
FIG. 4 is a diagrammatic plan view of a conventional semiconductor device.

FIG. 3 shows a diagrammatic plan view of a semiconductor device for elucidating a third embodiment of the present invention.

The embodiment in accordance with FIG. 3 differs from the embodiment in accordance with FIG. 2 essentially by the fact that the fuse pairs 21 are essentially at an acute angle 26 between the central interconnect 22, to which a predetermined potential 23, preferably ground, is applied, and the interconnects with the fuse regions 17. Furthermore, here as in FIG. 1 none of the contact devices 20 is provided in the region 24 not covered by the passivation layer 16. In accordance with the embodiment as shown in FIG. 3, all the interconnects situated in the region of the window 24 lie in the patterned, conductive interconnect plane 15. The contact devices 20 situated in the right-hand terminal region here primarily serve for rewiring in order to lead all the interconnects into the preferred patterned, conductive interconnect plane 13 at a distance from one another. The diagonal arrangement of the interconnect sections with the fuse regions 17 facilitates hitting by the laser pulse for blowing the fuse, since the diagonal course ensures a larger interconnect hit region than in the case of a right angle between the central interconnect 22 and the interconnect sections with the fuse regions 17.

A fuse module 27 as illustrated with four fuse pairs 21 in each case in FIG. 2 and FIG. 3 can be enlarged to six fuse pairs 21 in a simple manner and without appreciable area enlargement by using the patterned, electrically conductive interconnect plane 11 for interconnects. The area density of the fuses can be additionally increased as a result.

What is particularly advantageous about the embodiment according to FIG. 1A, in addition to the contact device 19, 20 lying below the passivation 16, is the fact that the fuses can be blown in two lines, whereas in the embodiments in accordance with FIG. 2 and FIG. 3 the laser device has to be aligned and adjusted four times with reference to the wafer. A fuse device preferably has a multiple of the respectively illustrated excerpts from fuse devices or fuse modules which adjoin laterally on the left and right in the embodiment in accordance with FIG. 1 and adjoin at the top and bottom in the same way in the embodiment in accordance with FIGS. 2 and 3.

Although the present invention has been described above using preferred exemplary embodiments, it is not restricted thereto, but rather can be modified in diverse ways.

Thus, in particular, extension to larger fuse modules is conceivable, for example with six instead of four fuse pairs with addition of further patterned, electrically conductive interconnect planes. Signal storage devices, or latches, adjoining the semiconductor device with fuse devices are preferably provided in a plurality of planes on account of the increased fuse area density by virtue of the device according to the invention, in order to forward the predetermined reference potential to the latch device or not to forward it with a closed fuse.

Moreover, the invention is not restricted to the above mentioned application possibility as a DRAM memory module.

What is claimed is:

1. A semiconductor device comprising:
   a first interconnect plane on a passivated substrate, the first interconnect plane being patterned and conductive,
   a second interconnect plane separated from the first interconnect plane by a passivation layer, the second interconnect plane being patterned and conductive,
   a conductive contact device selectively connecting the first and second interconnect planes,
   a fuse device in a nonpassivated section of the second interconnect plane for selectively linking interconnects,
   the fuse device being divided into fuse modules having fuse pairs that include fuse regions, the fuse regions being at a predetermined distance from one another, and selectively linked to a predetermined potential via a central interconnect.

2. The semiconductor device of claim 1, wherein said contact device is provided in a passivated section of the semiconductor device.

3. The semiconductor device of claim 1, wherein at least one of said fuse pairs extends at a right angle from said central interconnect.

4. The semiconductor device of claim 1, wherein at least one of said fuse pairs makes an acute angle relative to said central interconnect.

5. The semiconductor device of claim 1, further comprising:
   a third interconnect plane between the passivated substrate and the first interconnect plane, the third interconnect plane being patterned and conductive.

6. The semiconductor device of claim 1, further comprising a latch adjoining said interconnect plane, and selectively connected to the predetermined potential via said fuse device.

7. A DRAM comprising a semiconductor device as recited in claim 1.

8. A DDR-DRAM comprising a semiconductor device as recited in claim 1.

* * * * *